(12) United States Patent
Yu et al.

(10) Patent No.: US 8,941,183 B2
(45) Date of Patent: Jan. 27, 2015

(54) SEMICONDUCTOR DEVICE

(71) Applicant: Samsung Electronics Co., Ltd., Suwon-si (KR)

(72) Inventors: Cheong-Sik Yu, Seoul (KR); Choel-Hwyi Bae, Gunpo-si (KR); Ju-Youn Kim, Suwon-si (KR); Chang-Min Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/915,306

(22) Filed: Jun. 11, 2013

(65) Prior Publication Data

US 2014/0061809 A1     Mar. 6, 2014

(30) Foreign Application Priority Data

Aug. 31, 2012   (KR) .................. 10-2012-0096613

(51) Int. Cl.
*H01L 27/11*     (2006.01)

(52) U.S. Cl.
CPC .................................. *H01L 27/1104* (2013.01)
USPC .................................... 257/368; 257/E27.06

(58) Field of Classification Search
None
See application file for complete search history.

(56) References Cited

U.S. PATENT DOCUMENTS

| | | | |
|---|---|---|---|
| 7,488,635 B2 | 2/2009 | Winstead et al. | |
| 7,550,337 B2 * | 6/2009 | Chang et al. | 438/199 |
| 7,588,991 B2 | 9/2009 | Lee et al. | |
| 7,718,496 B2 * | 5/2010 | Frank et al. | 438/275 |
| 7,732,872 B2 | 6/2010 | Cheng et al. | |
| 7,786,466 B2 | 8/2010 | Appenzeller et al. | |
| 7,825,437 B2 | 11/2010 | Pillarisetty et al. | |
| 7,911,008 B2 | 3/2011 | Chen et al. | |
| 2010/0327366 A1 * | 12/2010 | Manabe et al. | 257/369 |
| 2011/0237063 A1 | 9/2011 | Kim et al. | |
| 2011/0306171 A1 * | 12/2011 | Lim et al. | 438/216 |
| 2014/0042546 A1 * | 2/2014 | Ando et al. | 257/368 |

FOREIGN PATENT DOCUMENTS

| | | |
|---|---|---|
| JP | 2008-130903 | 6/2008 |
| JP | 2009-170494 | 7/2009 |
| JP | 2010-098108 | 4/2010 |
| KR | 10-2011-0107206 | 9/2011 |

OTHER PUBLICATIONS

Hartstein, A., and N. Albert. "Determination of the Inversion-layer Thickness from Capacitance Measurements of Metal-oxide-semiconductor Field-effect Transistors with Ultrathin Oxide Layers." Physical Review B 38.2 (1988): 1235-240.*
Drapatz, Stefan. Parametric Reliability of 6T-SRAM Core Cell Arrays. Diss. Technischen Universitat Munchen (Munich U of Technology), 2012. Munich: Munich U of Technology, 2012.*

(Continued)

*Primary Examiner* — Joseph Schoenholtz
(74) *Attorney, Agent, or Firm* — Onello & Mello, LLP

(57) ABSTRACT

There is provided a semiconductor device comprising, at least one SRAM cell, wherein the SRAM cell includes a pull-up transistor, a pull-down transistor, and a pass-gate transistor, and an inversion-layer thickness (Tinv) of a gate stack of the pass-gate transistor is different from Tinv of a gate stack of the pull-up transistor and Tinv of a gate stack of the pull-down transistor.

19 Claims, 18 Drawing Sheets

(56) References Cited

OTHER PUBLICATIONS

Amelifard, B., et. al. "Leakage Minimization of SRAM Cells in a Dual-Vt and Dual-Tox Technology", IEEE Transactions on Very Large Scale Integration (VLSI) Systems, vol. 16, No. 7 (Jul. 2008) 851-860.*

Operating Systems, Version 0.71, Chapter 36 "I/O Devices" downloaded from URL<http://pages.cs.wisc.edu/~remzi/OSTEP/file-devices.pdf> on Apr. 25, 2014.*

"Introduction to Computer Systems" downloaded from URL "http://www.csi.ucd.ie/staff/jcarthy/home/Comsys_notes.html" on Apr. 25, 2014.*

Zhao, Chun, C. Z. Zhao, M. Werner, S. Taylor, and P. R. Chalker. "Advanced CMOS Gate Stack: Present Research Progress." ISRN Nanotechnology 2012 (2012): 1-35.*

Cartier, E.; Kerber, A.; Ando, T.; Frank, M.M.; Choi, K.; Krishnan, S.; Linder, B.; Zhao, K.; Monsieur, F.; Stathis, J.; Narayanan, V., "Fundamental aspects of HfO2-based high-k metal gate stack reliability and implications on tinv-scaling," Electron Devices Meeting (IEDM), 2011 IEEE International, vol., No., pp. 18.4.1,18.4.4, Dec. 5-7, 2011.*

King, Ya-Chin, Hiroshi Fujioka, Shiroo Kamohara, Kai Chen, and Chenming Hu. "Dc Electrical Oxide Thickness Model for Quantization of the Inversion Layer in MOSFETs." Semiconductor Science and Technology 13.8 (1998): 963-66.*

* cited by examiner

SEMICONDUCTOR DEVICE

CROSS-REFERENCE TO RELATED APPLICATIONS

This application is based on and claims priority from Korean Patent Application No. 10-2012-0096613, filed on Aug. 31, 2012 in the Korean Intellectual Property Office, the disclosure of which is incorporated herein in its entirety by reference.

FIELD OF THE INVENTION

The present invention relates to semiconductor devices, and more particularly to static random-access memory (SRAM) devices, and the like, and systems including and using such devices.

BACKGROUND

Static random-access memory (SRAM) is a type of semiconductor memory that uses bi-stable latching circuitry to store each bit. The term static differentiates it from dynamic RAM (DRAM), which must be periodically refreshed to overcome leakage of charge within the DRAM. Typical SRAM is considered volatile because stored data is eventually lost when the memory is not powered.

An SRAM cell has three different states: standby (the circuit is idle), reading (the data has been requested), and writing (updating the contents). For the SRAM to operate in read mode and write mode, it should have "readability" and "write stability," respectively.

A static RAM (SRAM) has a low memory capacity in comparison to a dynamic DRAM, but has an advantage that the SRAM has a higher operating speed. Accordingly, the SRAM has been widely used in a cache memory of a computer or a portable electronic device, which requires high speed operation.

SUMMARY

An approach to improving a minimum voltage limited yield (Vmin limited yield) of an SRAM, is to reduce a mismatch of a saturation threshold voltage (Vtsat) of a transistor within the SRAM.

The mismatch of the saturation threshold voltage of a pass-gate transistor is more greatly related to the minimum voltage limited yield of the SRAM than the mismatch of the saturation threshold voltage of a pull-down transistor or a pull-up transistor within the SRAM.

In accordance with aspects of the present invention, an SRAM is provided that solves the above-mentioned problems occurring in the prior art SRAMs. For instance, in accordance with the present invention, provided is a semiconductor device having a reduced mismatch of a saturation threshold voltage of a pass-gate transistor of a SRAM.

Additional advantages, subjects, and features of the invention will be set forth in part in the description which follows and in part will become apparent to those having ordinary skill in the art upon examination of the following or may be learned from practice of the invention.

According to an aspect of the present invention, there is provided a semiconductor device comprising, at least one SRAM cell, wherein the SRAM cell includes a pull-up transistor, a pull-down transistor, and a pass-gate transistor. An inversion-layer thickness (Tinv) of a gate stack of the pass-gate transistor is different from Tinv of a gate stack of the pull-up transistor and Tinv of a gate stack of the pull-down transistor.

In various embodiments, a nitrogen concentration of a gate insulating film of the pass-gate transistor may be different from a nitrogen concentration of a gate insulating film of the pull-up transistor and a nitrogen concentration of a gate insulating film of the pull-down transistor.

In various embodiments, the gate insulating film of each of the transistors may comprise a high-k material.

In various embodiments, an interface film may be formed between a substrate and the gate insulating film of each of the transistors, and a nitrogen concentration of the interface film of the pass-gate transistor may be different from a nitrogen concentration of the interface film of the pull-up transistor and a nitrogen concentration of the interface film of the pull-down transistor.

In various embodiments, a gate electrode of each of the transistors may comprise a first metal electrode formed on the gate insulating film and a second metal electrode formed on the first metal electrode, and a thickness of the second metal electrode of the pass-gate transistor is different from a thickness of the second metal electrode of the pull-up transistor and a thickness of the second metal electrode of the pull-down transistor.

In various embodiments, the first metal electrode of each of the transistors may comprise LaO, Y2O3, Lu2O3, SrO, or a combination thereof.

In various embodiments, the second metal electrode of each of the transistors may comprise TiN, TaN, or a combination thereof.

According to another aspect of the present invention, there is provided a semiconductor device comprising, at least one SRAM cell, wherein the SRAM cell includes a pull-up transistor, a pull-down transistor, and a pass-gate transistor. A nitrogen concentration of a gate insulating film of the pass-gate transistor is different from a nitrogen concentration of a gate insulating film of the pull-up transistor and a nitrogen concentration of a gate insulating film of the pull-down transistor.

In various embodiments, the gate insulating film of each of the transistors may comprise a high-k material.

In various embodiments, an interface film may be formed between a substrate and the gate insulating film of each of the transistors, and a nitrogen concentration of the interface film of the pass-gate transistor may be different from a nitrogen concentration of the interface film of the pull-up transistor and a nitrogen concentration of the interface film of the pull-down transistor.

In various embodiments, a gate electrode of each of the transistors may include a first metal electrode formed on a gate insulating film and a second metal electrode formed on the first metal electrode, and a thickness of the second metal electrode of the pass-gate transistor may be different from a thickness of the second metal electrode of the pull-up transistor and a thickness of the second metal electrode of the pull-down transistor.

In various embodiments, the first metal electrode of each of the transistors may comprise LaO, Y2O3, Lu2O3, SrO, or a combination thereof.

In various embodiments, the second metal electrode of each of the transistors may comprise TiN, TaN, or a combination thereof.

In various embodiments, an inversion-layer thickness (Tinv) of a gate stack of the pass-gate transistor may be different from a Tinv of a gate stack of the pull-up transistor and Tinv of a gate stack of the pull-down transistor.

According to still another aspect of the present invention, there is provided a semiconductor device comprising, at least one SRAM cell, wherein the SRAM cell includes a pull-up transistor, a pull-down transistor, and a pass-gate transistor. A gate electrode of each of the transistors includes a first metal electrode formed on a gate insulating film and a second metal electrode formed on the first metal electrode, and a thickness of the second metal electrode of the pass-gate transistor is different from a thickness of the second metal electrode of the pull-up transistor and a thickness of the second metal electrode of the pull-down transistor.

According to still another aspect of the present invention, there is provided an electronic system comprising a semiconductor device, including at least one SRAM device comprising a pull-up transistor, a pull-down transistor, and a pass-gate transistor, wherein nitrogen characteristics of the pass-gate transistor are different from nitrogen characteristics of the pull-up transistor and pull-down transistor. The system further comprises a controller, an input/output (I/O) device, an interface, and a bus configured to interconnect one or more of the controller, the I/O device, and the interface.

In various embodiments, a nitrogen concentration of a gate insulating film of the pass-gate transistor may be different from a nitrogen concentration of a gate insulating film of the pull-up transistor and a nitrogen concentration of a gate insulating film of the pull-down transistor.

In various embodiments, the gate insulating film of each of the transistors may comprise a high-k material.

In various embodiments, an interface film may be formed between a substrate and the gate insulating film of each of the transistors, and a nitrogen concentration of the interface film of the pass-gate transistor may be different from a nitrogen concentration of the interface film of the pull-up transistor and a nitrogen concentration of the interface film of the pull-down transistor.

In various embodiments, a gate electrode of each of the transistors may include a first metal electrode formed on a gate insulating film and a second metal electrode formed on the first metal electrode, and a thickness of the second metal electrode of the pass-gate transistor may be different from a thickness of the second metal electrode of the pull-up transistor and a thickness of the second metal electrode of the pull-down transistor.

In various embodiments, an inversion-layer thickness (Tinv) of a gate stack of the pass-gate transistor may different from a Tinv of a gate stack of the pull-up transistor and Tinv of a gate stack of the pull-down transistor.

According to another aspect of the present invention, provided is a method of making a semiconductor device comprising at least one SRAM cell, the method comprising framing a pull-up transistor, forming a pull-down transistor, and forming a pass-gate transistor, wherein a nitrogen concentration of a gate insulating film of the pass-gate transistor is different from a nitrogen concentration of a gate insulating film of the pull-up transistor and a nitrogen concentration of a gate insulating film of the pull-down transistor.

According to another aspect of the present invention, provided is a method of making a semiconductor device comprising at least one SRAM cell, the method comprising forming a pull-up transistor, forming a pull-down transistor, and forming a pass-gate transistor, wherein an inversion-layer thickness (Tinv) of a gate stack of the pass-gate transistor is different from Tinv of a gate stack of the pull-up transistor and Tinv of a gate stack of the pull-down transistor.

According to other aspects of the invention, provided is a semiconductor device as shown and described with respect to the drawings.

According to other aspects of the invention, provided is a system having a semiconductor device as shown and described with respect to the drawings.

According to other aspects of the invention, provided is a method of making a semiconductor device as shown and described with respect to the drawings.

BRIEF DESCRIPTION OF THE DRAWINGS

The present invention will become more apparent by describing preferred embodiments in accordance therewith, including those depicted in the attached drawings, in which.

DETAILED DESCRIPTION OF THE EMBODIMENTS

Figure 1:
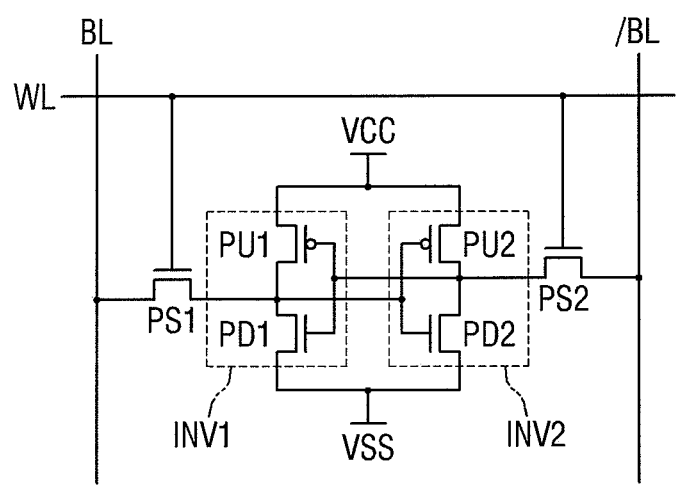
FIG. 1 is a schematic circuit diagram of an embodiment of a semiconductor device, according to aspects of the present invention.

Presently preferred embodiments in accordance with the present invention will now be described more fully hereinafter with reference to the accompanying drawings. This invention may, however, be embodied in different forms and should not be construed as limited to the embodiments set forth herein. In the drawings and specification, the same reference numbers indicate the same or corresponding components. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same holds true for use of the phrases "coupled to" and "directly coupled to," "connected to" and "directly connected to," and the like.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments in accordance with the present invention may be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation. It is understood, therefore, that actual implementations of the invention may not identically conform to the embodiments depicted in the drawings due, for example, to variations caused by physical characteristics of materials used and the manufacturing process.

Hereinafter, with reference to FIGS. 1 and 2, an embodiment of a semiconductor device according to aspects of the present invention will be described. FIG. 1 is a schematic circuit diagram of an embodiment of a semiconductor device according to aspects of the present invention, and FIG. 2 is a schematic layout diagram of an embodiment of a semiconductor device according to aspects of the present invention.

Figure 2:
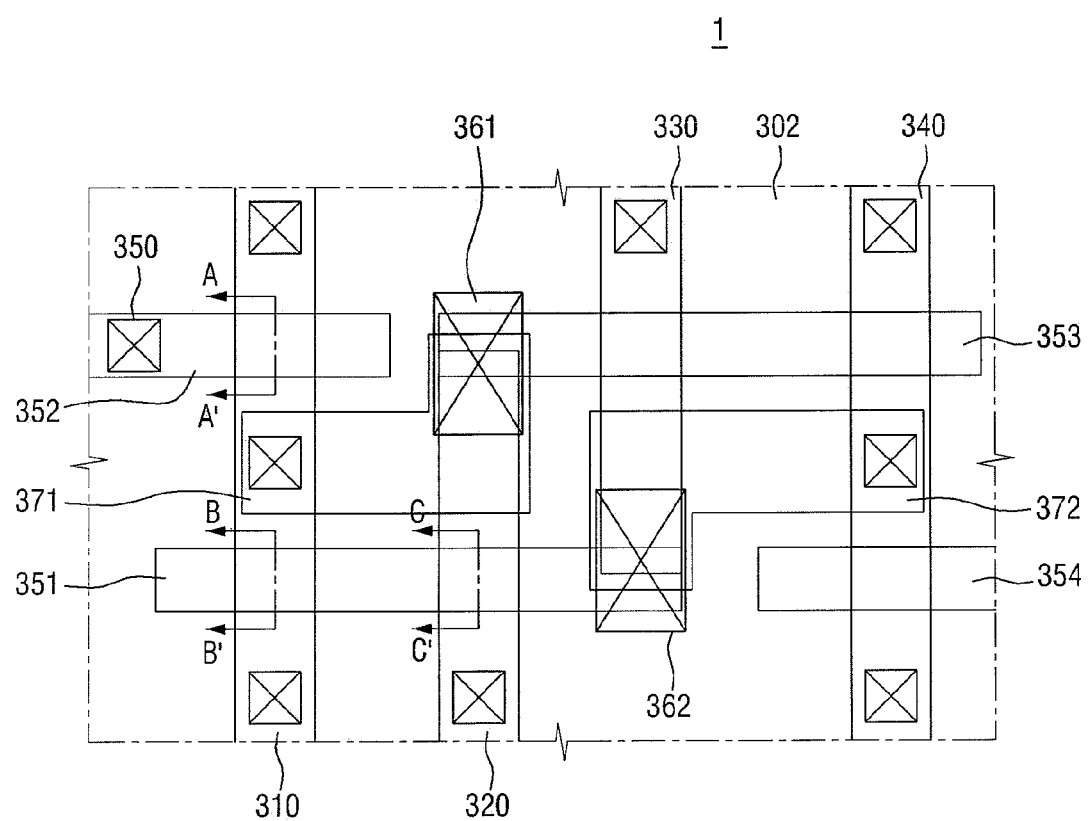
FIG. 2 is a schematic layout diagram of an embodiment of a semiconductor device, according to aspects of the present invention.

Referring to FIGS. 1 and 2, a semiconductor device according to aspects of the present invention includes at least one SRAM cell 1.

As illustrated in the embodiment of FIG. 1, the SRAM cell 1 may include a pair of inverters INV1 and INV2 connected in parallel between a power supply node VCC and a ground node VSS. A first pass-gate transistor PS1 and a second pass-gate transistor PS2 are connected to output nodes of the inverters INV1 and INV2, respectively. The first pass-gate transistor PS1 and the second pass-gate transistor PS2 may be connected to a bit line BL and a complementary bit line BL/, respectively. Gates of the first pass-gate transistor PS1 and the second pass-gate transistor PS2 may be connected to a word line WL.

In this embodiment, the first inverter INV1 includes a first pull-up transistor PU1 and a first pull-down transistor PD1 connected in series, and the second inverter INV2 includes a second pull-up transistor PU2 and a second pull-down transistor PD2 also connected in series. The first pull-up transistor PU1 and the second pull-up transistor PU2 may be PMOS (P-channel MOSFET) transistors, and the first pull-down transistor PD1 and the second pull-down transistor PD2 may be NMOS (N-channel MOSFET) transistors, as shown in FIG. 1 for this embodiment.

In order to configure one latch circuit with the first inverter INV1 and the second inverter INV2, an input node of the first inverter INV1 is connected to an output node of the second inverter INV2, and an input node of the second inverter INV2 is connected to an output node of the first inverter INV1.

As illustrated in the embodiment of FIG. 2, in the SRAM cell 1, a first active region 310, a second active region 320, a third active region 330, and a fourth active region 340 are formed to be spaced apart from one another and to extend lengthwise in one direction (for example, upper/lower direction in FIG. 2). The second active region 320 and the third active region 330 may have an extension length that is shorter than an extension length of the first active region 310 and the fourth active region 340.

A first gate electrode 351, a second gate electrode 352, a third gate electrode 353, and a fourth gate electrode 354 are formed to extend long in the other direction (for example, left/right direction) and to cross the first to fourth active regions 310 to 340. Specifically, the first gate electrode 351 may completely cross the first active region 310 and the second active region 320, and at least partially overlap an end of the third active region 330. The third gate electrode 353 may completely cross the fourth active region 340 and the third active region 330, and at least partially overlap an end of the second active region 320. The second gate electrode 352 and the fourth gate electrode 354 are formed to cross the first active region 310 and the fourth active region 340, respectively.

The first pull-up transistor PU1 is defined in an area where the first gate electrode 351 and the second active region 320 cross each other, the first pull-down transistor PD1 is defined in an area where the first gate electrode 351 and the first active region 310 cross each other, and the first pass-gate transistor PS1 is defined in an area where the second gate electrode 352 and the first active region 310 cross each other. The second pull-up transistor PU2 is defined in an area where the third gate electrode 353 and the third active region 330 cross each other, the second pull-down transistor PD2 is defined in an area where the third gate electrode 353 and the fourth active region 340 cross each other, and the second pass-gate transistor PS2 is defined in an area where the fourth gate electrode 354 and the fourth active region 340 cross each other.

Although not clearly illustrated, source/drain regions of the pull-up transistors and the pull-down transistors may be formed on both sides of a region where the first to fourth gate electrodes 351 to 354 cross the first to fourth active regions 310 to 340. Further, a plurality of contacts 350 may be formed coupling to the first to fourth active regions 310 to 340.

A first shared contact 361 simultaneously connects the second active region 320, the third gate electrode 353, and a first wiring 371. A second shared contact 362 simultaneously connects the third active region 330, the first gate electrode 351, and a second wiring 372.

In a SRAM, as an inversion-layer thickness (Tinv) of a transistor becomes thinner, a mismatch of a saturation threshold voltage may be reduced, and a minimum voltage limited yield of the SRAM may be improved. However, as the Tinv of the transistor becomes thinner, leakage current of the transistor may be increased, and if all the Tinvs of the pass-gate transistor and the pull-down transistor become thinner, standby leakage current (Istby) of the respective transistors becomes further increased. Here, the Tinv means an average position or a centroid of an inversion charge below an interface between a substrate and a gate insulating film.

The mismatch of the saturation threshold voltage of the pass-gate transistor is more greatly related to the minimum voltage limited yield of the SRAM than the mismatch of the saturation threshold voltage of the pull-down transistor and the pull-up transistor. However, deterioration of the standby leakage current depending on the thinning of the Tinv of the pass-gate transistor is very small. This is because most of the leakage current that is increased in the pass-gate transistor is gate leakage current Igon and the gate leakage current does not contribute to the standby leakage current. Further, this is because the increase of the standby leakage current of the pass-gate transistor can be compensated for by the improvement of the minimum voltage limited yield as described above.

Accordingly, in the semiconductor device according to an embodiment of the present invention, in order to decrease the mismatch of the saturation threshold voltage of the pass gate, a method for adjusting the Tinv of the pass-gate transistor is provided. Further, in order to adjust the Tinv of the pass-gate transistor, a method for forming the gate stack of the pass-gate transistor differently from the gate stack of the pull-up transistor and the pull-down transistor is provided.

Hereinafter, with reference to cross-sectional views taken along lines A-A', B-B', and C-C' of FIG. 2, an embodiment of a semiconductor device according to aspects of the present invention will be described. The lines A-A', B-B', and C-C' correspond to the first pass-gate transistor, the first pull-down transistor, and the first pull-up transistor, respectively, such as PS1, PD1, and PU1 in FIG. 1. However, the present invention is not limited thereto, but may also be applied to the second pass-gate transistor, the second pull-down transistor, and the second pull-up transistor, such as PS2, PD2, and PU2 in FIG. 1, in substantially the same manner.

Figure 3:
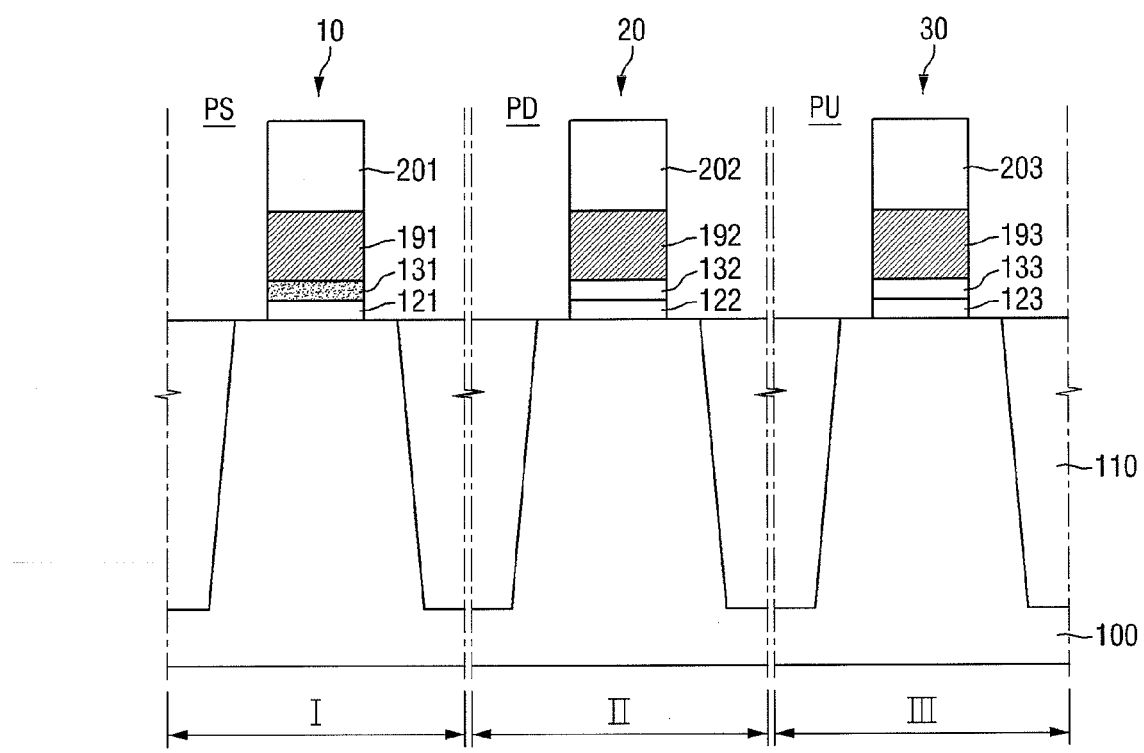
FIG. 3 is a schematic cross-sectional view of a first embodiment of a semiconductor device, according to aspects of the present invention.

Hereinafter, referring to FIG. 3, the semiconductor device according to a first embodiment will be described. FIG. 3 is a schematic cross-sectional view of a semiconductor device according to a first embodiment of the present invention.

Referring to a first embodiment in accordance with the present invention shown in FIG. 3, on a substrate 100 of the semiconductor device a first region I, a second region II, and a third region III are defined. The first region I corresponds to the cross section taken along the line A-A', the second region II corresponds to the cross section taken along the line B-B', and the third region III corresponds to the cross section taken along the line C-C'.

A pass-gate transistor PS may be formed in the first region I of the substrate 100, a pull-down transistor PD may be formed in the second region II of the substrate 100, and a pull-up transistor PU may be formed in the third region III of the substrate 100. The pass-gate transistor PS and the pull-down transistor PD may be NMOS transistors, and the pull-up transistor may be a PMOS transistor, in this embodiment.

The substrate 100 may be, for example, a rigid substrate, such as a substrate made of one or more semiconductor materials selected from the group consisting of Si, Ge, SiGe, GaP, GaAs, SiC, SiGeC, InAs, and InP, a SOI (Silicon On Insulator) substrate, a quartz substrate, or a glass substrate for display, or a flexible plastic substrate made of polyimide, PET (PolyEthylene Terephthalate), PEN (PolyEthylene Naphthalate), PMMA (PolyMethyl MethAcrylate), PC (PolyCarbonate), PES (PolyEtherSulfone), or polyester.

The pass-gate transistor PS, the pull-down transistor PD, and the pull-up transistor PU may include gate stacks 10, 20, and 30 and source/drain regions, respectively. Here, the gate stacks 10, 20, and 30 include interface films 121 to 123, gate insulating films 131 to 133, and respective gate electrodes 191 to 193 and 201 to 203, respectively.

The interface films 121 to 123 prevent inferior interfaces between the substrate 100 and the gate insulating films 131 to 133. The interface films 121 to 123 may include a low-k material layer having a permittivity that is equal to or less than 9, for example, a silicon oxide film or a silicon oxynitride film. Further, the interface films 121 to 123 may be made of silicate or a combination of the above-exemplified films.

The gate insulating films 131 to 133 may be formed on the interface films 121 to 123, respectively. The gate insulating films 131 to 133 may include a material, which is a high-k material, selected from the group consisting of $HfO_2$, $ZrO_2$, $Ta_2O_5$, $TiO_2$, $SrTiO_3$, and $(Ba, Sr)TiO_3$. The gate insulating films 131 to 133 may be formed to have a thickness that is sufficient for operability, depending on the material that is included therein.

The respective gate electrodes, which are formed of respective metal electrodes 191 to 193 and silicon electrodes 201 to 203, are formed on the gate insulating films 131 to 133. The gate electrodes may be formed from laminates of metal electrodes 191 to 193 and silicon electrodes 201 to 203, but are not limited thereto. The metal electrodes 191 to 193 may include, for example, TiN, and the silicon electrodes 201 to 203 may include, for example, amorphous silicon.

The source/drain regions 110 may be arranged on both sides of the gate stacks 10, 20, and 30 in the substrate 100. An n-type impurity may be injected onto the source/drain regions of the pass-gate transistor PS and the pull-down transistor PD, a p-type impurity may be injected onto the source/drain regions of the pull-up transistor PU, and a channel region may be formed between a pair of source/drain regions.

LaO may be included in the gate insulating films 131 and 132 of the pass-gate transistor PS and the pull-down transistor PD, but may not be included in the gate insulating film 133 of the pull-up transistor PU. LaO serves to adjust a work function and a threshold voltage Vt of the NMOS transistor. Further, AlO may be included in the gate insulating film 133 of the pull-up transistor PU, but may not be included in the gate insulating films 131 and 132 of the pass-gate transistor PS and the pull-down transistor PD. AlO serves to adjust the work function and the threshold voltage Vt of the PMOS transistor. Accordingly, the operating characteristics of the NMOS transistor and the PMOS transistor can be improved.

Additionally, in the semiconductor device according to the first embodiment, in order to adjust the Tinv of the pass-gate transistor PS, the nitrogen concentration of the gate insulating film 131 of the pass-gate transistor PS is different from the nitrogen concentration of the gate insulating film 132 of the pull-down transistor PD and the gate insulating film 133 of the pull-up transistor PU. More specifically, a part of the gate insulating film 131 of the first region I may be nitrified, and the gate insulating film 131 of the first region I may have a relatively higher nitrogen concentration and a relative lower concentration of the high-k film than the gate insulating films 132 and 133 of the remaining second and third regions II and III.

Further, the nitrogen concentration of the interface film 121 of the pass-gate transistor PS may be different from the nitrogen concentration of the interface film 122 of the pull-down transistor PD and the interface film 123 of the pull-up transistor PU. More specifically, in the process of nitrifying a part of the gate insulating film 131 of the first region I, the interface film 121 of the first region I may utilize a relatively higher nitrogen concentration than the interface films 122 and 123 of the remaining second and third regions II and III.

Figure 4:
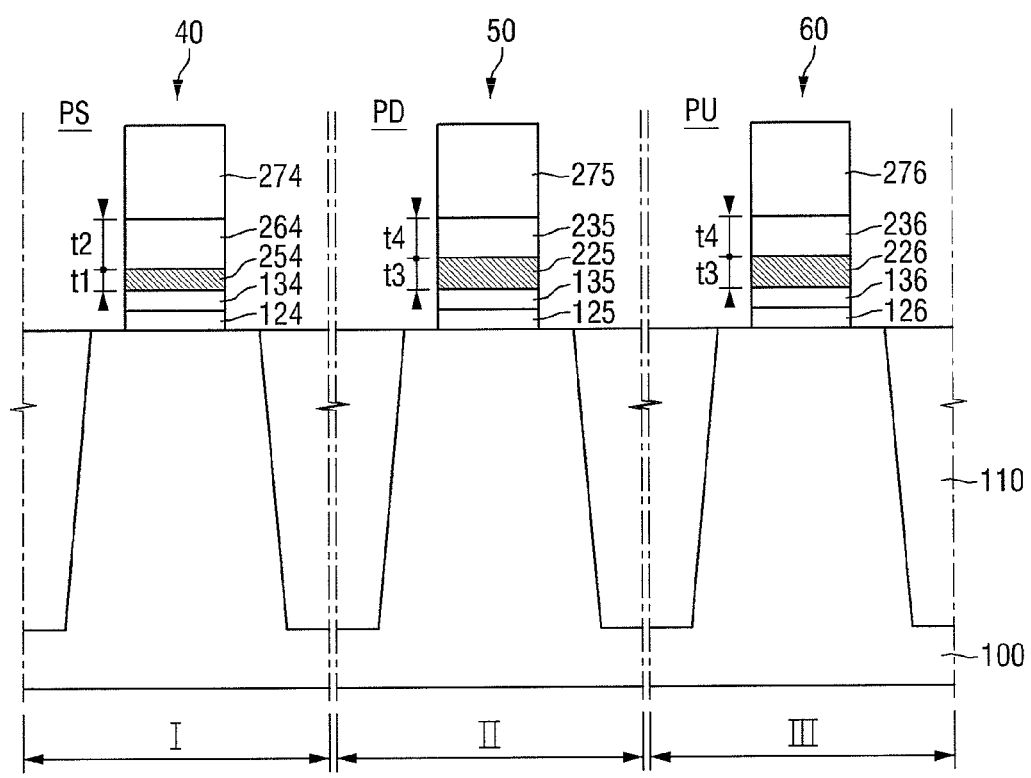
FIG. 4 is a schematic cross-sectional view of second embodiment of a semiconductor device, according to aspects of the present invention.

Hereinafter, referring to FIG. 4, a second embodiment of a semiconductor device according to aspects of the present invention will be described. FIG. 4 is a schematic cross-sectional view of a semiconductor device according to a second embodiment of the present invention. For convenience in explanation, the explanation will point out differences from FIG. 3; therefore descriptions of portions of the device of FIG. 4 which may be the same or substantially similar to the device of FIG. 3 will not be repeated here.

Referring to the embodiment of FIG. 4, on a substrate 100 a first region I, a second region II, and a third region III are defined.

A pass-gate transistor PS may be formed in the first region I of the substrate 100, a pull-down transistor PD may be formed in the second region II of the substrate 100, and a pull-up transistor PU may be formed in the third region III of the substrate 100. The pass-gate transistor PS and the pull-down transistor PD may be NMOS transistors, and the pull-up transistor PU may be a PMOS transistor, in this embodiment.

The pass-gate transistor PS, the pull-down transistor PD, and the pull-up transistor PU may include gate stacks 40, 50, and 60 and source/drain regions 110, respectively. Here, the gate stacks 40, 50, and 60 include interface films 124 to 126, gate insulating films 134 to 136, and respective gate electrodes.

The interface films 124 to 126 prevent inferior interfaces between the substrate 100 and the gate insulating films 134 to 136, and may be formed in substantially the same manner as the interface films 121 to 123 in FIG. 3.

The gate insulating films 134 to 136 are formed on the interface films 124 to 126, respectively. The gate insulating films 134 to 136 may include a material, which is a high-k material, selected from the group consisting of $HfO_2$, $ZrO_2$, $Ta_2O_5$, $TiO_2$, $SrTiO_3$, and $(Ba, Sr)TiO_3$.

The respective gate electrodes are formed on the gate insulating films 134 to 136. The gate electrodes may be formed as laminates of metal electrodes and silicon electrodes 274 to 276. The metal electrodes may include first metal electrodes 254, 225, and 226 formed on the gate insulating films 134 to 136, respectively, and second metal electrodes 264, 235, and 236 formed on the first metal electrodes 254, 225, and 226, respectively. The first metal electrodes 254, 225, and 226 may include, for example, LaO, Y203, Lu203, SrO, or a combination thereof, and the second metal electrodes 264, 235, and 236 may include, for example, TiN, TaN, or a combination thereof. The silicon electrodes 274 to 276 may include, for example, amorphous silicon.

The source/drain regions 110 may be arranged on both sides of the gate stacks 40, 50, and 60 in the substrate 100, and may be formed in substantially the same manner as the source/drain regions 110 in FIG. 3.

Additionally, in the semiconductor device according to the second embodiment, in order to adjust the Tinv of the pass-gate transistor PS, the thickness of the second metal electrode 264 of the pass-gate transistor PS is made to be different from the thickness of the second metal electrode 235 of the pull-down transistor PD and the second metal electrode 236 of the pull-up transistor PU.

More specifically, the first metal electrode 254 of the first region I has a first thickness t1, and the second metal electrode 264 has a second thickness t2. The first metal electrodes 225 and 226 of the second and third regions II and III have a third thickness t3, and the second electrodes 235 and 236 have a fourth thickness t4. Further, the first thickness t1 is relatively thinner than the third thickness t3, and the second thickness t2 is relatively thicker than the fourth thickness t4. Here, in this embodiment, the overall thickness (sum of the first thickness t1 and the second thickness t2) of the metal electrodes of the first region I is equal to, or substantially equal to, the overall thickness (sum of the third thickness t3 and the fourth thickness t4) of the metal electrodes of the second and third regions II and III.

Figure 5:
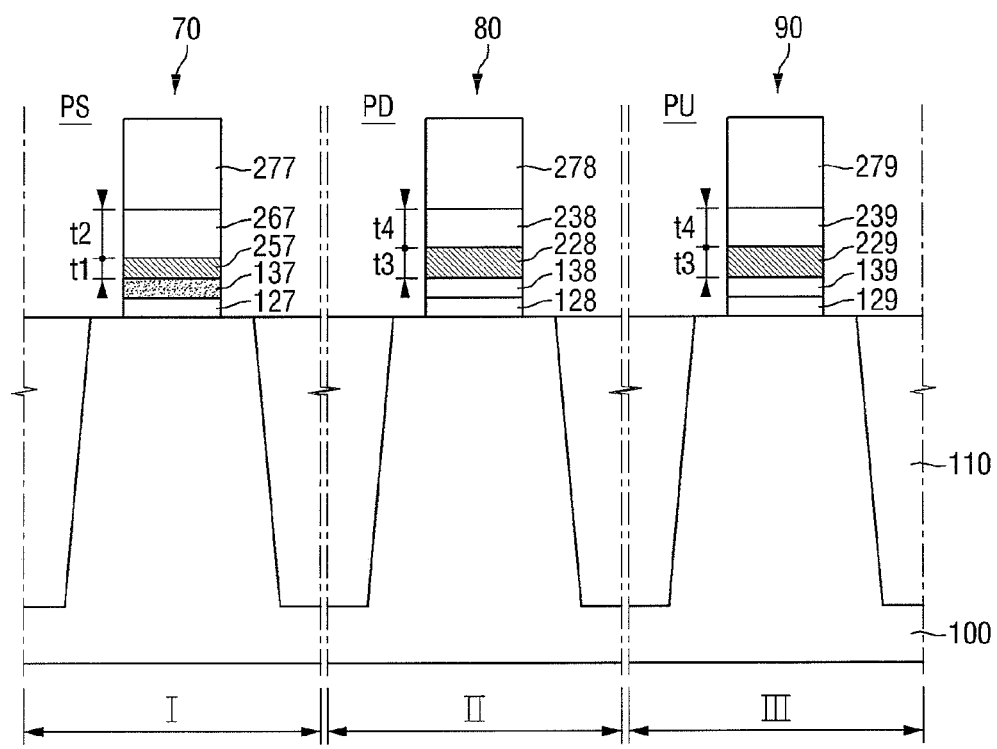
FIG. 5 is a schematic cross-sectional view of a third embodiment of semiconductor device, according to aspects of the present invention.

Hereinafter, referring to FIG. 5, a third embodiment of a semiconductor device according to aspects of the present invention will be described. FIG. 5 is a schematic cross-sectional view of the semiconductor device according to a third embodiment. For convenience in explanation, the explanation will be made to point out difference from FIGS. 3 and 4; therefore descriptions of portions of the device of FIG. 5 which may be the same or substantially similar to the devices of FIG. 3 or 4 will not be repeated here.

A pass-gate transistor PS may be formed in the first region I of the substrate 100, a pull-down transistor PD may be formed in the second region II of the substrate 100, and a pull-up transistor PU may be formed in the third region III of the substrate 100. The pass-gate transistor PS and the pull-down transistor PD may be NMOS transistors, and the pull-up transistor PU may be a PMOS transistor.

The pass-gate transistor PS, the pull-down transistor PD, and the pull-up transistor PU may include gate stacks 70, 80, and 90 and source/drain regions 110, respectively. Here, the gate stacks 70, 80, and 90 include interface films 127 to 129, gate insulating films 137 to 139, and respective gate electrodes.

The interface films 127 to 129 prevent inferior interfaces between the substrate 100 and the gate insulating films 137 to 139, and may be formed in substantially the same manner as the interface films 121 to 123 in FIG. 3.

The gate insulating films 137 to 139 are formed on the interface films 127 to 129, respectively, and may be formed in substantially the same manner as the gate insulating films 131 to 133 in FIG. 3.

The respective gate electrodes are formed on the gate insulating films 137 to 139. The gate electrodes may be formed from laminates of metal electrodes and silicon electrodes 277 to 279. The metal electrodes may include first metal electrodes 257, 228, and 229 formed on the gate insulating films 137 to 139, respectively, and second electrodes 267, 238, and 239 formed on the first metal electrodes 257, 228, and 229. The first metal electrodes 257, 228, and 229 may include, for example, LaO, Y203, Lu203, SrO, or a combination thereof, and the second metal electrodes 267, 238, and 239 may include, for example, TiN, TaN, or a combination thereof. The silicon electrodes 277 to 279 may include, for example, amorphous silicon.

The source/drain regions 110 may be arranged on both sides of the gate stacks 70, 80, and 90 in the substrate 100, and may be formed in substantially the same manner as the source/drain regions in FIG. 3.

Additionally, in the semiconductor device according to the third embodiment, in order to adjust the Tinv of the pass-gate transistor PS, the nitrogen concentration of the gate insulating film 137 of the pass-gate transistor is different from the nitrogen concentration of the gate insulating film 138 of the pull-down transistor PD and the gate insulating film 139 of the pull-up transistor PU. More specifically, a part of the gate insulating film 137 of the first region I may be nitrified, and the gate insulating film 137 of the first region I may have a relatively higher nitrogen concentration and a relative lower concentration of the high-k film than the gate insulating films 138 and 139 of the remaining second and third regions II and III.

Further, the nitrogen concentration of the interface film 127 of the pass-gate transistor PS may be different from the nitrogen concentration of the interface film 128 of the pull-down transistor PD and the interface film 129 of the pull-up transistor PU. More specifically, in the process of nitrifying a part of the gate insulating film 137 of the first region I, the interface film 127 of the first region I may have a relatively higher nitrogen concentration than the interface films 128 and 129 of the remaining second and third regions II and III.

Further, in the semiconductor device of the third embodiment, in order to adjust the Tinv of the pass-gate transistor PS, the thickness of the second metal electrode 267 of the pass-gate transistor PS is different from the thickness of the second metal electrode 238 of the pull-down transistor PD and the second metal electrode 239 of the pull-up transistor PU.

More specifically, the first metal electrode 257 of the first region I has a first thickness t1, and the second metal electrode 267 has a second thickness t2. The first metal electrodes 228 and 229 of the second and third regions II and III have a third thickness t3, and the second electrodes 238 and 239 have a fourth thickness t4. Further, the first thickness t1 is relatively thinner than the third thickness t3, and the second thickness t2 is relatively thicker than the fourth thickness t4. Here, the overall thickness (sum of the first thickness t1 and the second thickness t2) of the metal electrodes of the first region I is equal to, or substantially equal to, the overall thickness (sum of the third thickness t3 and the fourth thickness t4) of the metal electrodes of the second and third regions II and III.

Hereinafter, referring to FIGS. 6 to 13, an embodiment of a method for fabricating a semiconductor device according to the first embodiment of the present invention will be described. FIGS. 6 to 13 are cross-sectional views explaining intermediate steps of a method for fabricating the semiconductor device of FIG. 3.

Figure 6:
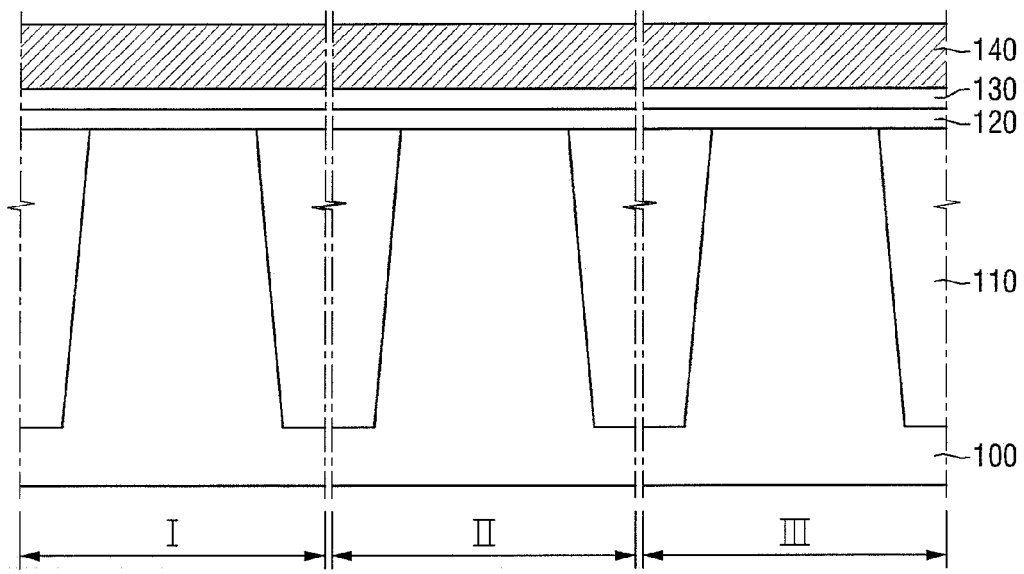
FIGS. 6 to 13 are cross-sectional views explaining intermediate steps of an embodiment of a method for fabricating the semiconductor device of FIG. 3, according to aspects of the present invention.

Referring to the exemplary embodiment of FIG. 6, a substrate 100 is first prepared. As described above, the substrate 100 may be a rigid substrate, such as a substrate that is made of one or more semiconductor materials selected from the group consisting of Si, Ge, SiGe, GaP, GaAs, SiC, SiGeC, InAs, and InP, a SOI substrate, a quartz substrate, or a glass substrate for display, or a flexible plastic substrate made of polyimide, PET, PEN, PMMA, PC, PES, or polyester.

Then, a device isolation region 110 that defines an active region is formed on the substrate 100. At this time, the device isolation region 110 may be formed of STI (Shallow Trench Isolation) or FOX (Field Oxide). The device isolation region 110 may define active regions of the first region I, the second region II, the third region III, and a fourth region IV on the substrate 100, in substantially the same manner. The foregoing step is generally understood in the art, so not described herein in detail.

Then, an interface material layer 120 for forming interface films 121 to 123 is formed on the substrate 100. As described above, the interface material layer 120 may be formed of a silicon oxide film, a silicon oxynitride film, or silicate, as examples. The interface material layer 120 may be formed, for example, by cleaning the substrate 100 with ozone gas or ozone water.

Then, an insulating material layer 130 for forming gate insulating films 131 to 133 is formed on the interface material layer 120. As described above, the insulating material layer 130 may be formed of a material, for example a high-k material, selected from the group consisting of $HfO_2$, $ZrO_2$, $Ta_2O_5$, $TiO_2$, $SrTiO_3$, or $(Ba, Sr)TiO_3$.

The insulating material layer 130 may be formed using, for example, a process of CVD (Chemical Vapor Deposition), PECVD (Plasma Enhanced Chemical Vapor Deposition), PVD (Physical Vapor Deposition), ALD (Atomic Layer Deposition), or PEALD (Plasma Enhanced Atomic Layer Deposition).

Then, a first work function control material layer 140 is formed on the insulating material layer 130. The first work function control material layer 140 may include, for example, Al. More specifically, the first work function control material layer 140 may include a lower TiN film, an Al film, and an upper TiN film, which are sequentially laminated in a stacked configuration. Further, the first work function control material layer 140 may exclude the lower TiN film and include the Al film and the upper TiN film, which are sequentially laminated.

The first work function control material layer 140 may be formed using, for example, a process of CVD, PECVD, PVD, ALD, or PEALD.

Figure 7:
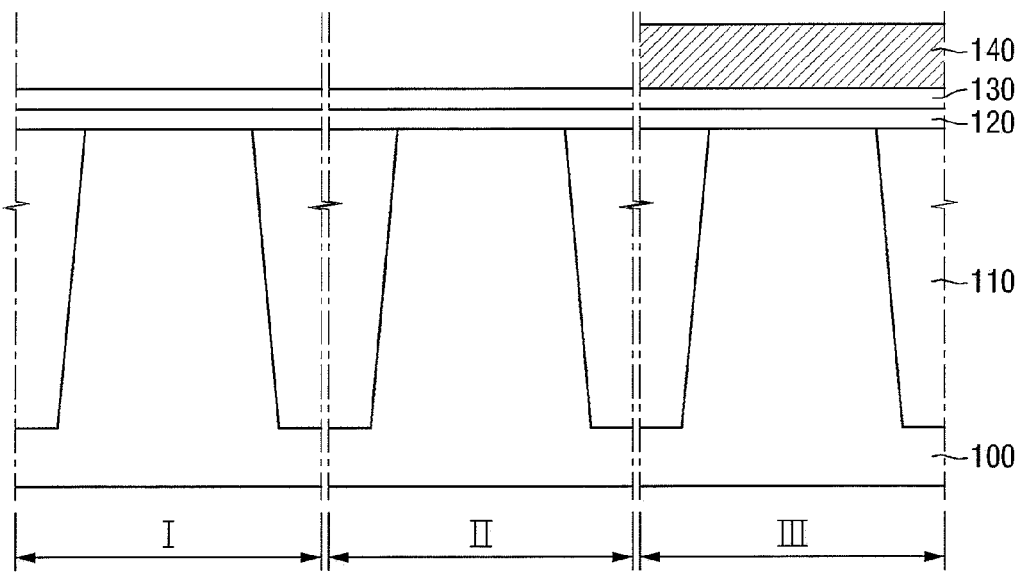

Then, referring to the exemplary embodiment of FIG. 7, a first mask film (not illustrated) is formed on the first work function control material layer 140. The first mask film may include, for example, a silicon nitride film or a silicon oxynitride film. Then, a first mask pattern is formed by patterning the first mask film, such as by known techniques. The first mask pattern may be formed using, for example, a photoresist pattern or hard mask process. Portions of the first work function control material layer 140 of the first and second regions I and II of the substrate are exposed, depending on the first mask pattern. Then, an exposed region of the first work function control material layer 140 is etched using the first mask pattern as a mask. Accordingly, the first work function control material layer 140 is formed only on the insulating material layer 130 of the third region III of the substrate 100, but is not formed on the insulating material layer 130 of the first and second regions I and II of the substrate 100. Then, an upper surface of the first work function control material layer 140 is exposed by removing the first mask pattern.

Figure 8:
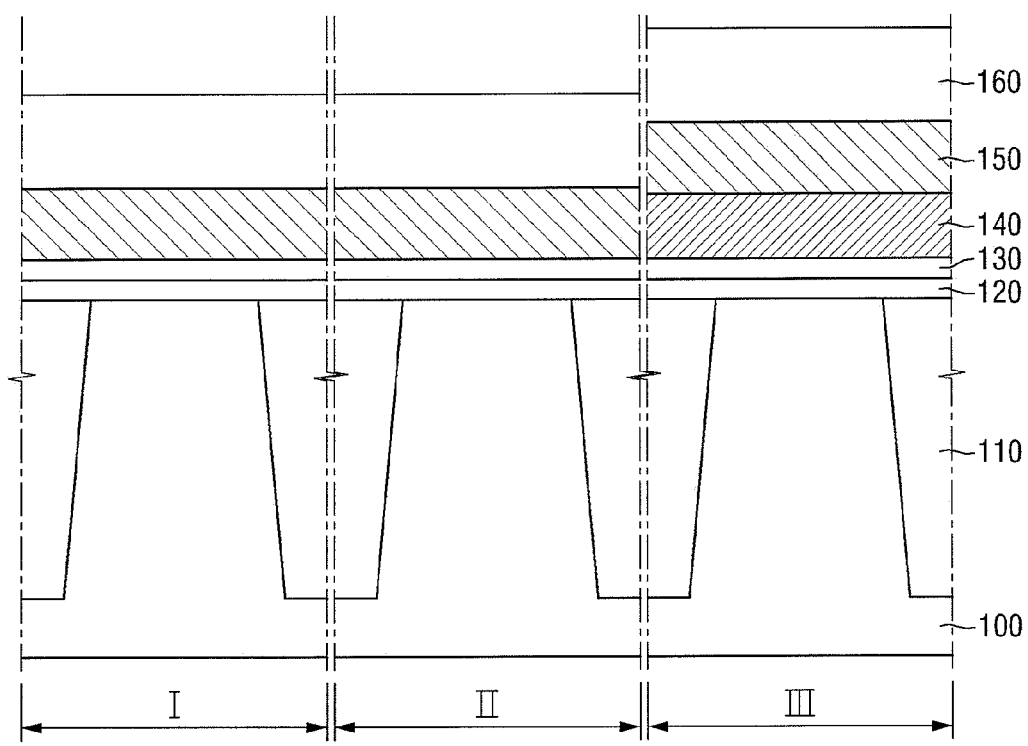

Then, referring to the exemplary embodiment of FIG. 8, a second work function control material layer 150 is conformally formed on the insulating material layer 130 and the first work function control material layer 140. The second work function control material layer 150 may include, for example, La. More specifically, the second work function control material layer 150 may include a La film and a TiN film, which are sequentially laminated. Further, the second work function control material layer 150 may include a La film, a TiN film, and a polysilicon film, which are sequentially laminated.

The second work function control material layer 150 may be formed using, for example, a process of CVD, PECVD, PVD, ALD, or PEALD.

Then, a first barrier layer 160 may be conformally formed on the second work function control material layer 150. The first barrier layer 160 may include, for example, amorphous silicon. The first barrier layer 160 serves to prevent the first work function control material layer 140 and the second work function control material layer 150 from being oxidized in an annealing process 410 to be described later.

Figure 9:
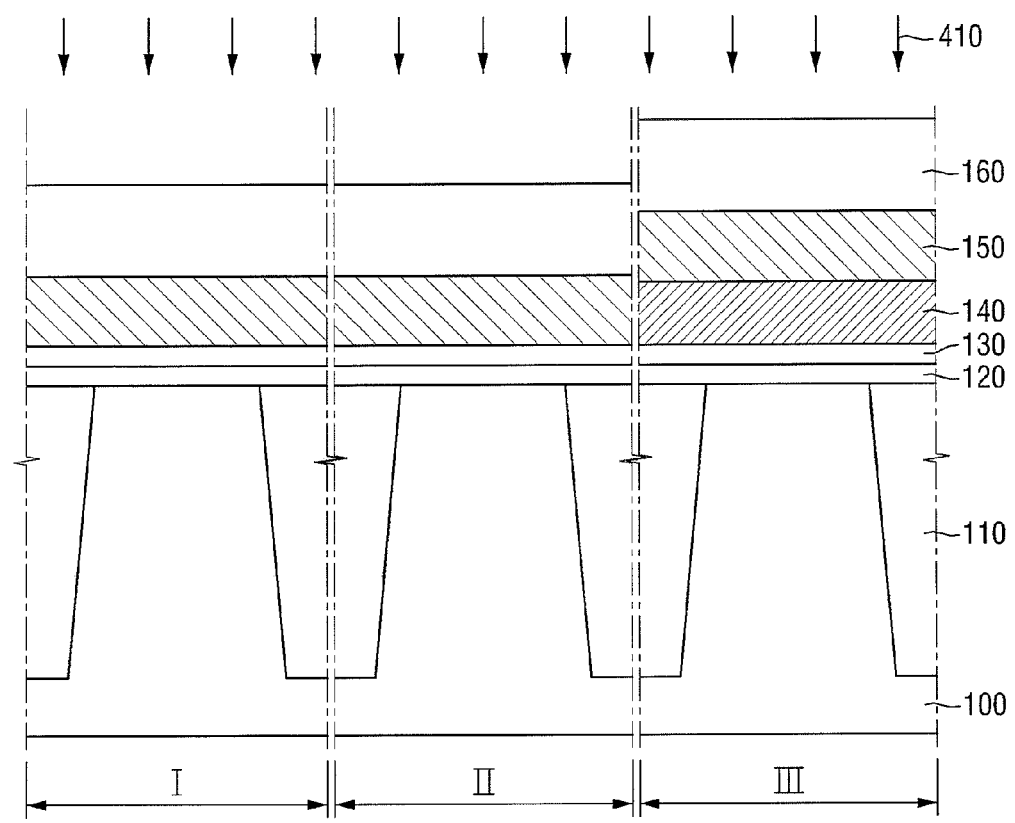

Then, referring to the exemplary embodiment of FIG. 9, the first work function control material layer 140 and the second work function control material layer 150 are diffused into the insulating material layer 130 by performing the annealing process 410. More specifically, the first work function control material Al is diffused into the insulating material layer 130 of the third region III of the substrate 100. Further, the second work function control material La is diffused into the insulating material layer 130 of the first and second regions I and II of the substrate 100. Here, since La is unable to pass through the first work function control material layer 140, it is unable to be diffused into the insulating material layer 130 of the third region III of the substrate 100. As a result, LaO is included in the insulating material 130 of the first and second regions I and II of the substrate 100, and AlO is included in the insulating material layer 130 of the first and second regions I and II of the substrate 100.

Figure 10:
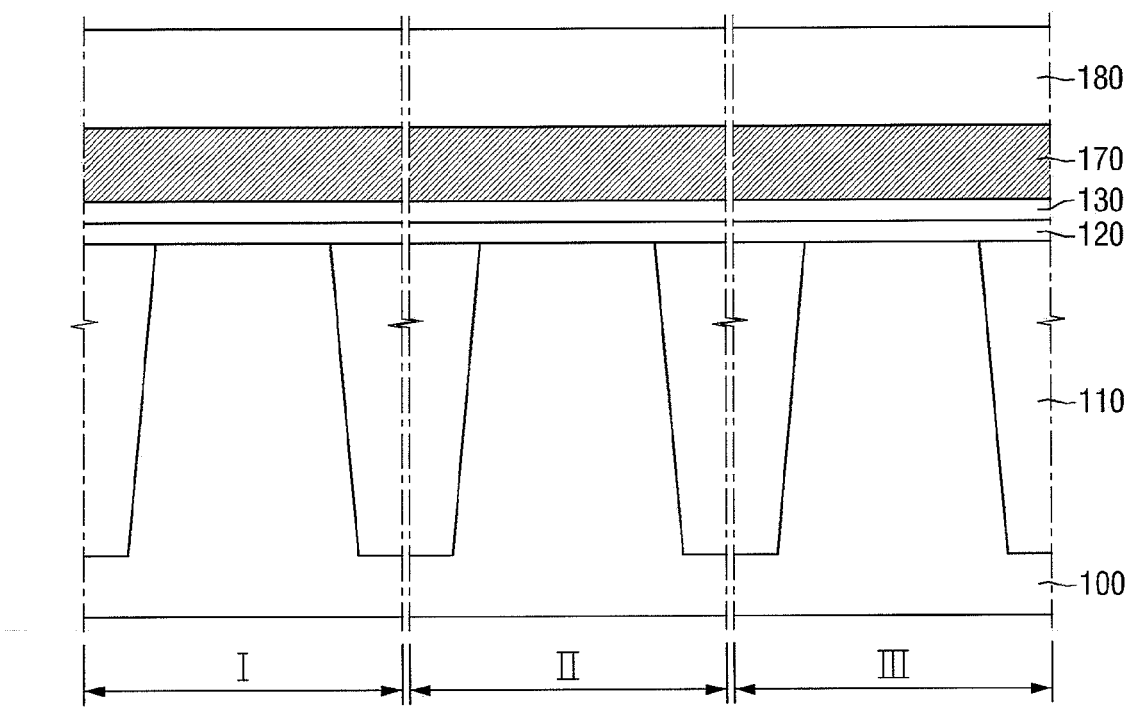

Then, referring to the exemplary embodiment of FIG. 10, an upper surface of the insulating material layer 130 is exposed by removing the first work function control material layer 140, the second work function material layer 150, and the first barrier layer 160, which remain on the insulating material layer 130. Then, a first metal layer 170 is formed on the insulating material 130. The first metal layer 170 may be formed of or include various materials, and for example, may include TiN. Then, a first silicon layer 180 is fanned on the first metal layer 170. The first silicon layer 180 may include, for example, amorphous silicon. The first metal layer 170 and the first silicon layer 180 serve as masks to prevent the insulating material layer 130 of the second and third regions II and III of the substrate 100 from being nitrified during a nitrifying process 420 to be described herein below.

Figure 11:
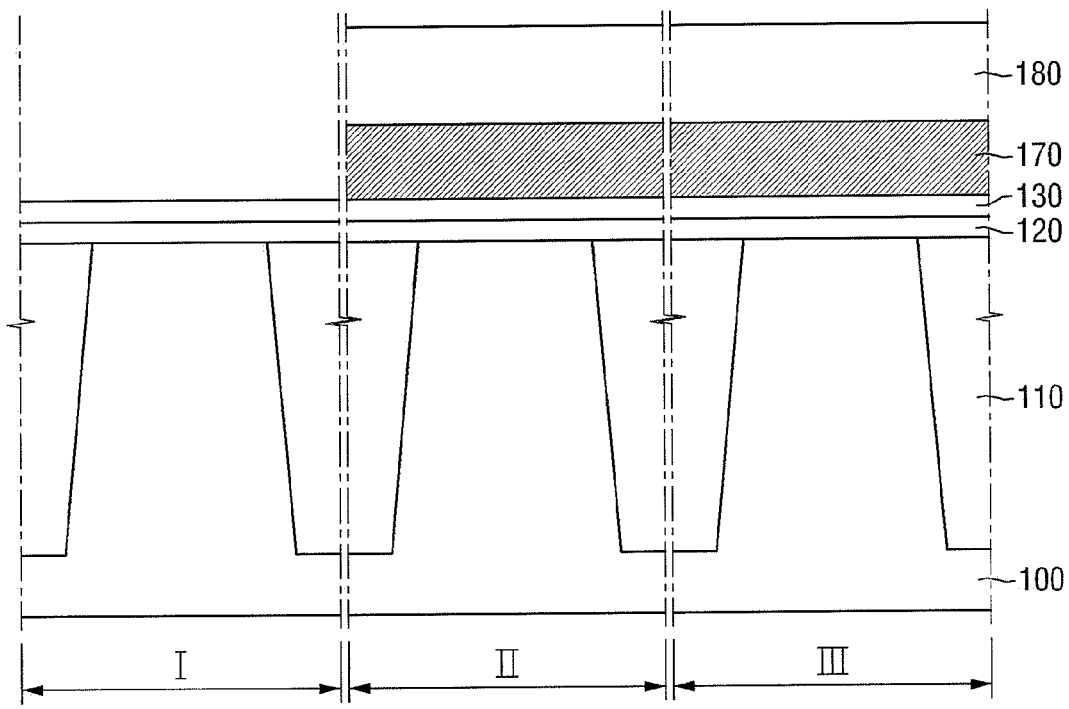

Then, referring to the exemplary embodiment of FIG. 11, a second mask film (not illustrated) is formed on the first silicon layer 180. The second mask film may include, for example, a silicon nitride film or a silicon oxynitride film. Then, a second mask pattern is formed by patterning the second mask film, such as by known techniques. The second mask pattern may be formed using, for example, a photoresist pattern or hard mask process. The first silicon layer 180 of the first region I of the substrate 100 is exposed according to the second mask pattern. Then, the first silicon layer 180 and the first metal layer 170 are sequentially etched using the second mask pattern as a mask. Accordingly, an upper surface of the insulating material layer 130 of the first region I of the substrate 100 is exposed. Then, the second mask pattern that remains on the first silicon layer 180 is removed.

Figure 12:
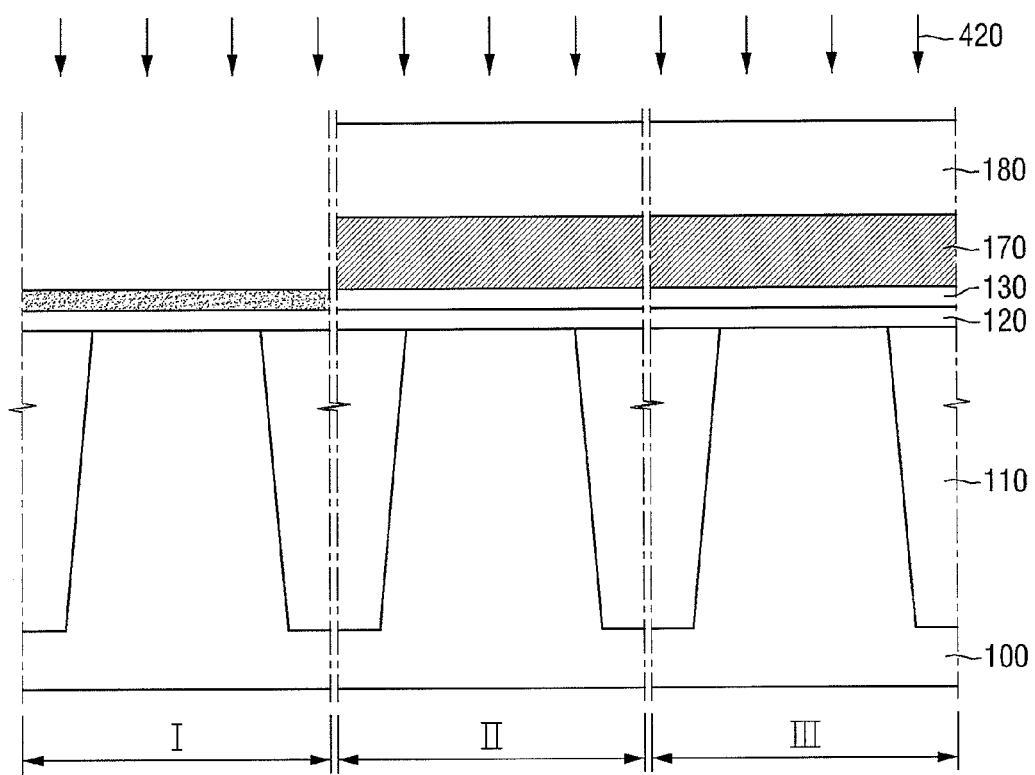

Then, referring to the exemplary embodiment of FIG. 12, the exposed region of the insulating material layer 130 is nitrified by performing a nitrifying process 420, such as those nitrifying processes known in the art. Accordingly, the insulating material layer 130 of the first region I of the substrate 100 has a relatively higher nitrogen concentration and a relative lower concentration of the high-k film than the insulating material layer 130 of the second and third regions II and III of the substrate 100. The nitrifying process 420 may use, for example, a plasma nitrifying process or a gas nitrifying process. At this time, the interface material layer 120 of the first region I of the substrate 100 may have a relatively higher nitrogen concentration than the interface material layer 120 of the second and third regions II and III of the substrate 100.

Figure 13:
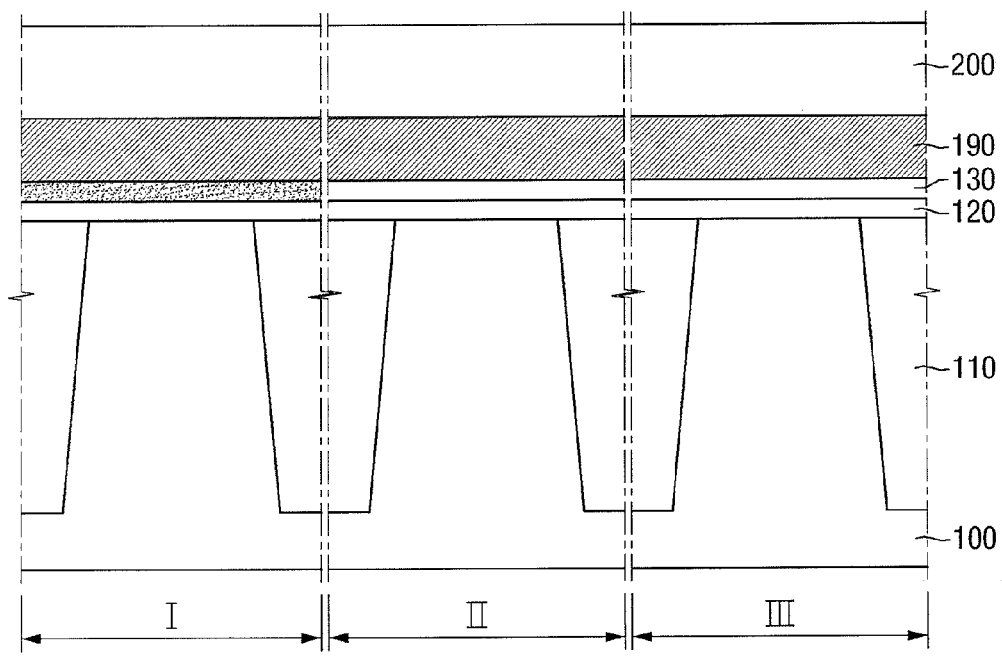

Then, referring to the exemplary embodiment of FIG. 13, an upper surface of the insulating material film 130 is exposed by removing the first metal layer 170 and the first silicon layer 180 that remain on the insulating material layer 130. Then, a second metal layer 190 for forming metal electrodes 191 to 193 is formed on the insulating material layer 130. The second metal layer 190 may be made of various materials, and for example, may include TiN. Then, a second silicon layer 200 for forming silicon electrodes 201 to 203 is formed on the second metal layer 190. The second silicon layer 200 may include, for example, amorphous silicon.

Referring again to the exemplary embodiment of FIG. 3, the second silicon layer 200, the second metal layer 190, the insulating material layer 130, and the interface material layer 120 are sequentially etched by performing an etching process. At this time, the etching process may use, for example, an RIE (Reactive Ion Etching) process. Accordingly, respective gate stacks 10, 20, and 30 of the pass-gate transistor PS, the pull-down transistor PD, and the pull-up transistor PU are formed on the substrate 100. Here, the gate stacks 10, 20, and 30 include the interface films 121 to 123, the gate insulating films 131 to 133, and the gate electrodes 191 to 193 and 201 to 203, respectively.

Then, respective source/drain regions 110 of the pass-gate transistor, the pull-down transistor, and the pull-up transistor are formed by injecting impurities onto the active regions of the substrate 100. At this time, the respective source/drain regions 110 may be formed by DDD (Double Diffused Drain) or LDD (Lightly Doped Drain), as examples.

Hereinafter, referring to FIGS. 14 to 19, an embodiment of a method for fabricating the semiconductor device according to the second embodiment of the present invention will be described. FIGS. 14 to 19 are cross-sectional views explaining intermediate steps of a method for fabricating the semiconductor device of FIG. 4. For convenience in explanation, the detailed explanation of the same steps as those in FIGS. 6 to 13 will be omitted.

Figure 14:
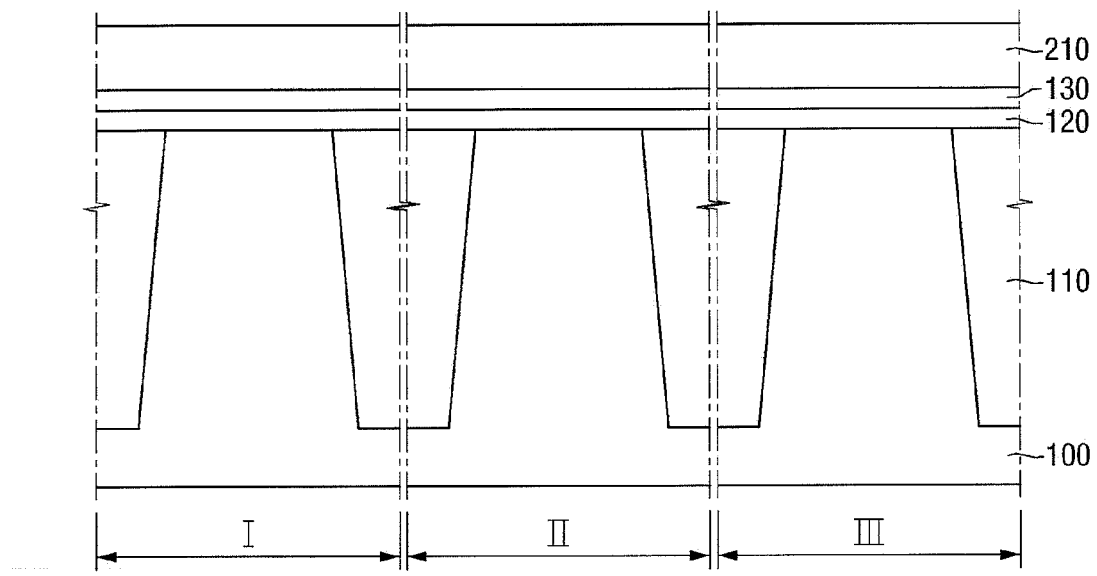
FIGS. 14 to 19 are cross-sectional views explaining intermediate steps of an embodiment of a method for fabricating the semiconductor device of FIG. 4, according to aspects of the present invention.

Subsequent to the step of FIG. 9, referring to FIG. 14, an upper surface of the insulating material layer 130 is exposed by removing the first work function control material layer 140, the second work function material layer 150, and the first barrier layer 160, which remain on the insulating material layer 130. Then, a third silicon layer 210 is formed on the insulating material layer 130. The third silicon layer 210 may include, for example, amorphous silicon.

Figure 15:
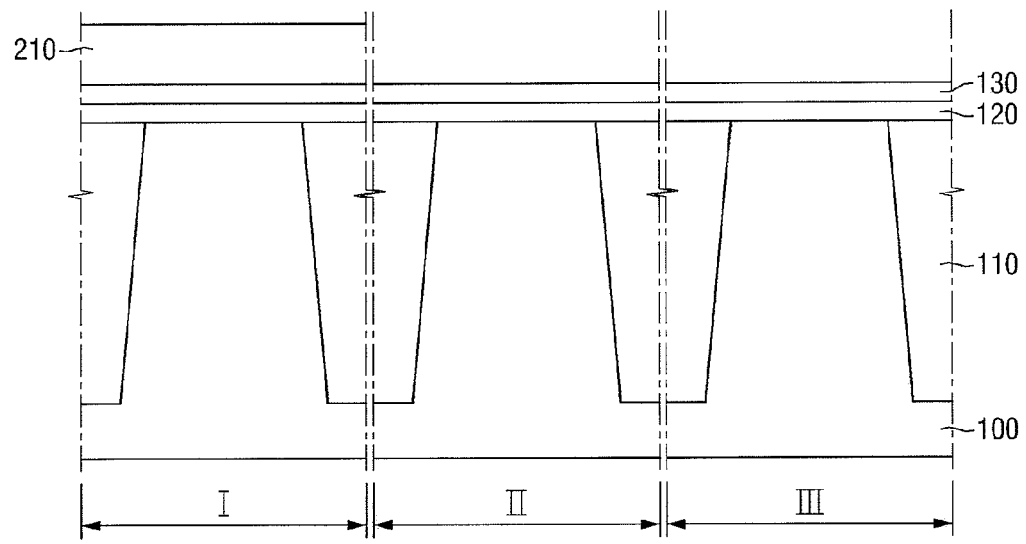

Then, referring to FIG. 15, a third mask film (not illustrated) is formed on the third silicon layer 210. Then, a third mask pattern is formed by patterning the third mask film, such as by known techniques. The third mask pattern may be formed using, for example, a photoresist pattern or hard mask process. The third silicon layer 210 of the second and third regions II and III of the substrate 100 is exposed depending on the third mask pattern. Then, the exposed region of the third silicon layer 210 is etched using the third mask pattern as a mask. Accordingly, the insulating material layer 130 of the second and third silicon layer 210 of the substrate 100 is exposed. Accordingly, the insulating material layer 130 of the second and third regions II and III of the substrate 100 is exposed. Then, the upper surface of the third silicon layer 210 is exposed by removing the third mask pattern that remains on the third silicon layer 210.

Figure 16:
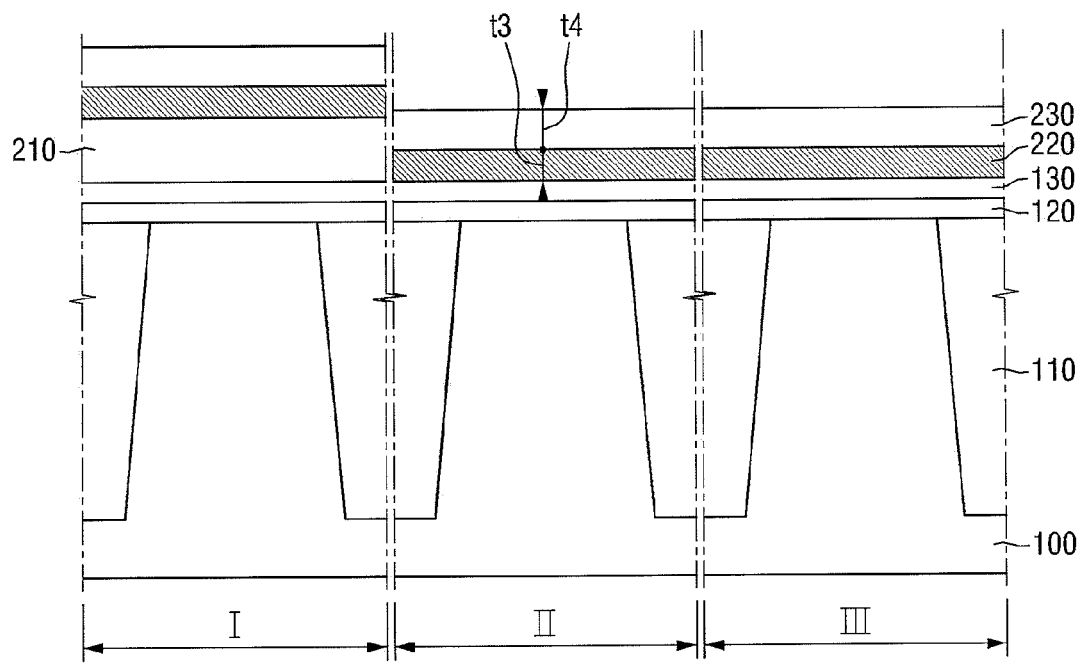

Then, referring to the exemplary embodiment of FIG. 16, a third metal layer 220 for forming the first metal electrodes 225 and 226 is conformally formed on the third silicon layer 210. Then, a fourth metal layer 230 for forming the second metal electrodes 235 and 236 is conformally formed on the third metal layer 220. The third metal layer 220 may include, for example, LaO, Y2O3, Lu2O3, SrO, or a combination thereof, and the fourth metal layer 230 may include, for example, TiN, TaN, or a combination thereof. At this time, the third metal layer 220 is formed with a third thickness t3, and the fourth metal layer 230 is formed with a fourth thickness t4.

Figure 17:
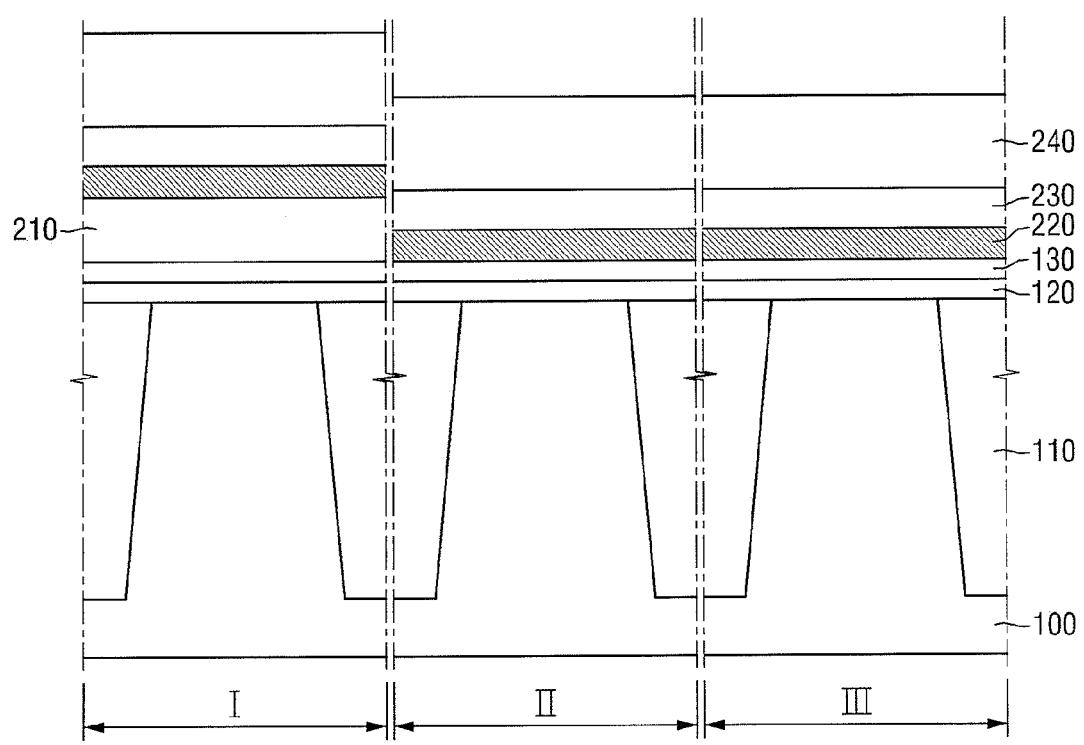

Then, referring to the exemplary embodiment of FIG. 17, a fourth silicon layer 240 is conformally formed on the fourth metal layer 230. The fourth silicon layer 240 may include, for example, amorphous silicon.

Figure 18:
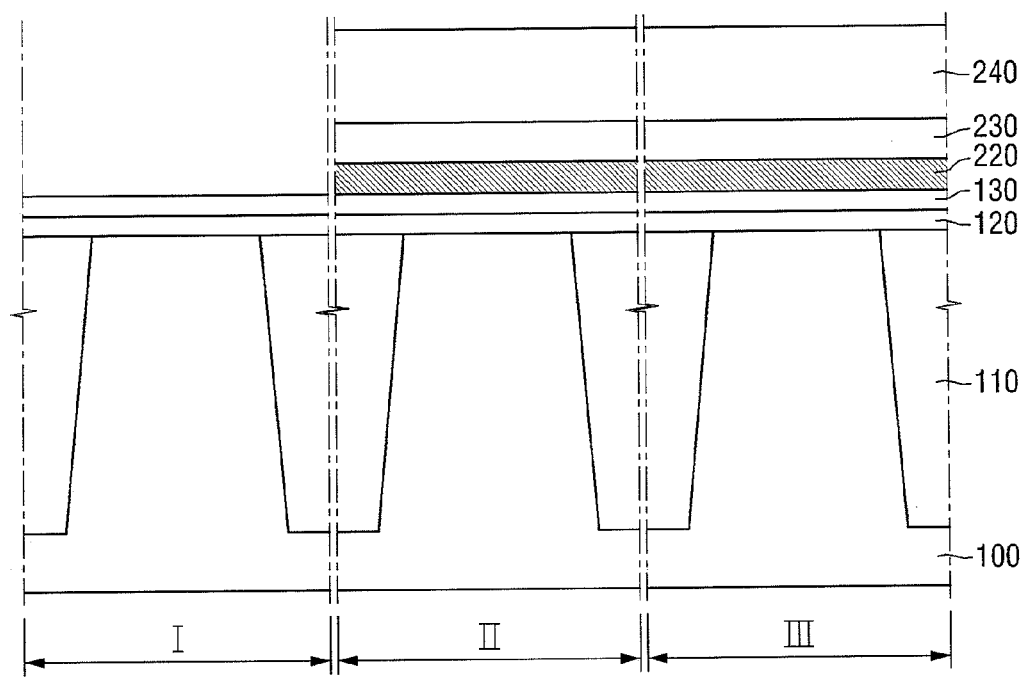

Then, referring to the exemplary embodiment of FIG. 18, a fourth mask film (not illustrated) is formed on the four silicon layer 240. The fourth mask film may include, for example, a silicon nitride film or a silicon oxynitride film. Then, a fourth mask pattern is formed by patterning the fourth mask film, such as by known techniques. The fourth mask pattern may be formed using, for example, a photoresist pattern or hard mask process. The fourth silicon layer 240 of the first region I of the substrate 100 is exposed depending on the fourth mask pattern. Then, the fourth silicon layer 240, the fourth metal layer 230, the third metal layer 220, and the third silicon layer 210 are sequentially etched using the fourth mask pattern as a mask. Accordingly, the upper surface of the insulating material layer 130 of the first region I of the substrate 100 is exposed. Then, the upper surface of the fourth silicon layer 240 is exposed by removing the fourth mask that remains on the fourth silicon layer 240.

Figure 19:
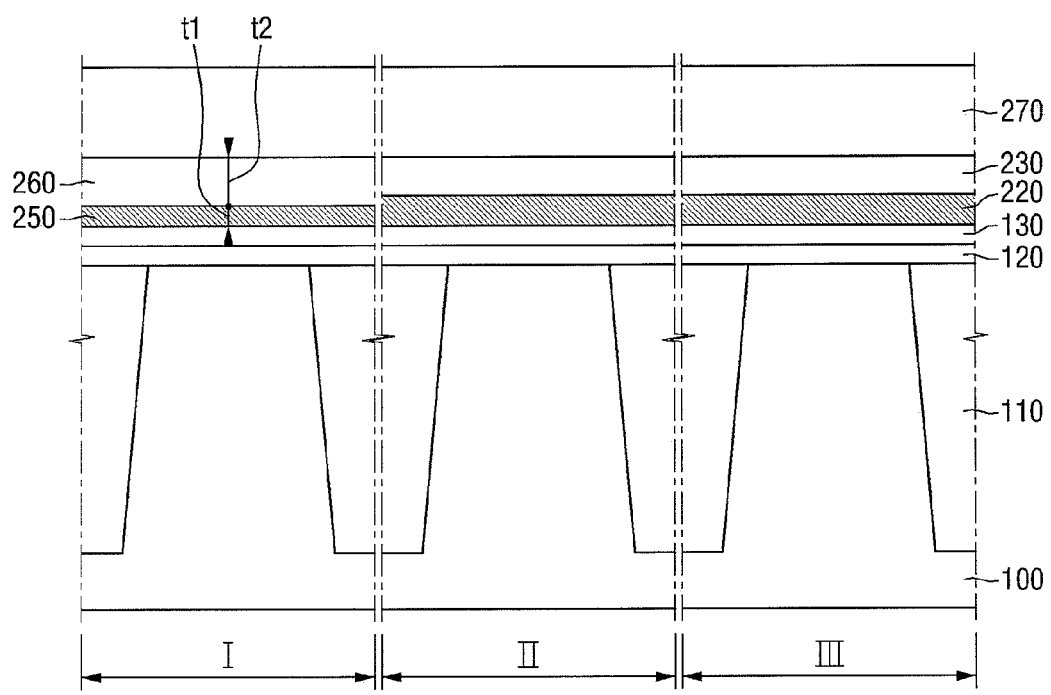

Then, referring to the exemplary embodiment of FIG. 19, a fifth metal layer 250 for forming the first metal electrode 254 is formed on the insulating material layer 130 of the first region I of the substrate 100. Then, a sixth metal layer 260 for forming the second metal electrode 264 is formed on the fifth metal layer 250. The fifth metal layer 250 may include, for example, LaO, Y2O3, Lu2O3, SrO, or a combination thereof, and the sixth metal layer 260 may include, for example, TiN, TaN, or a combination thereof. At this time, the fifth metal layer 250 is formed with a first thickness t1, and the sixth metal layer 260 is formed with a second thickness t2. At this time, the first thickness t1 is relatively thinner than the third thickness t3, and the second thickness t2 is relatively thicker than the fourth thickness t4. Here, the overall thickness (sum of the first thickness t1 and the second thickness t2) of the metal layer of the first region I is equal to the overall thickness (sum of the third thickness t3 and the fourth thickness t4) of the metal layer of the second and third regions II and III.

Then, the upper surface of the fourth metal layer 230 is exposed by removing portions of the fourth silicon layer 240 that remain on the fourth metal layer 230. Then, a fifth silicon layer 270 for forming the silicon electrodes 274 to 276 is formed on the fourth metal layer 230 and the sixth metal layer 260. The fifth silicon layer 270 may include, for example, amorphous silicon.

Referring again to the exemplary embodiment of FIG. 4, the fifth silicon layer 270, the third to sixth metal layers 220, 230, 250, and 260, the insulating material layer 130, and the interface material layer 120 are sequentially etched by performing an etching process. At this time, the etching process may use, for example, a RIE (Reactive Ion Etching) process. Accordingly, respective gate stacks 40, 50, and 60 of the pass-gate transistor PS, the pull-down transistor PD, and the pull-up transistor PU are formed on the substrate 100. Here, the gate stacks 40, 50, and 60 include the interface films 124 to 126, the gate insulating films 134 to 136, and the respective gate electrodes.

Then, respective source/drain regions of the pass-gate transistor PS, the pull-down transistor PD, and the pull-up transistor PU are formed by injecting impurities onto the active regions of the substrate 100. At this time, the respective source/drain regions 110 may be formed by DDD (Double Diffused Drain) or LDD (Lightly Doped Drain), as examples.

Since the method for fabricating the semiconductor device according to the third embodiment would be apparent to those of ordinary skill in the art, with reference to FIGS. 6 to 19 as described above, the detailed explanation thereof will be omitted.

Figure 20:
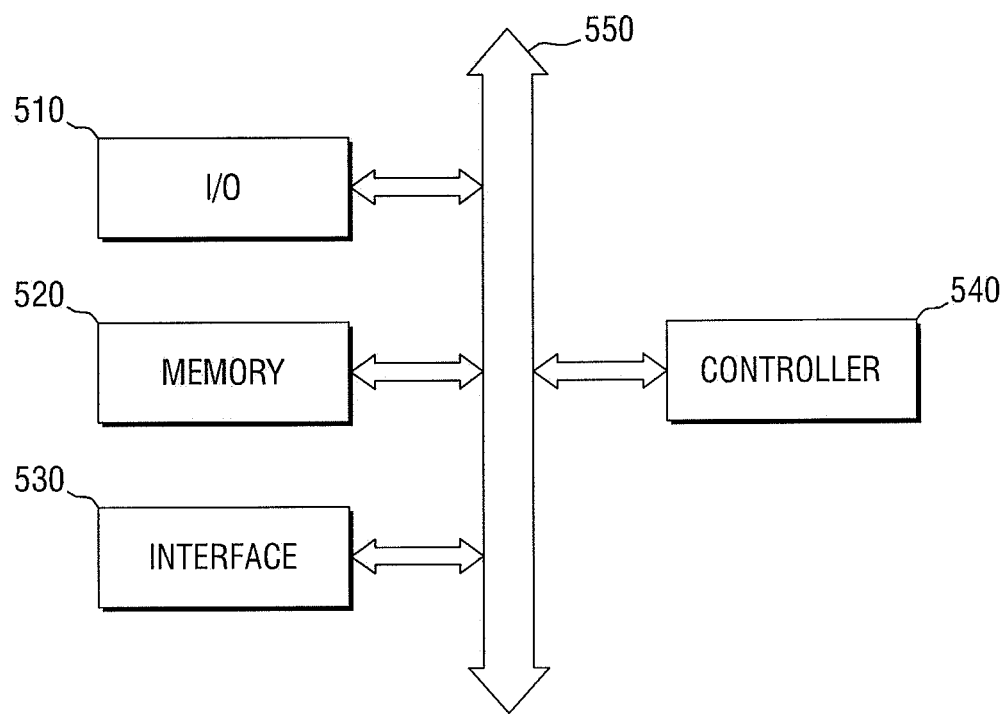
FIG. 20 is a schematic block diagram of an embodiment of an electronic system including a semiconductor device according to aspects of the present invention.

FIG. 20 is a schematic block diagram of an embodiment of an electronic system including a semiconductor device according to the embodiments described herein, or other embodiments of the present invention.

Referring to the exemplary embodiment of FIG. 20, an electronic system 2 may include a controller 540, an input/output (I/O) device 510, a memory 520, an interface 530, and a bus 550. The controller 540, the I/O device 510, the memory 520, and/or the interface 530 may be coupled to one another through the bus 550. The bus 550 corresponds to paths through which data is transferred.

The controller 540 may include at least one of a microprocessor, a digital signal processor, a microcontroller, and logic elements that can perform similar functions. The I/O device 510 may include a keypad, a keyboard, mouse, audio input, video input, and/or a display device, as examples. The memory 520 may store data and/or commands. The interface 530 may function to transmit data to a communication network or to receive data from the communication network. The interface 530 may be of a wired or wireless type, or a combination thereof. For example, the interface 530 may include an antenna or a wire/wireless transceiver. Although not illustrated, the electronic system 2 may further include a high-speed DRAM and/or SRAM as an operating memory for improving the operation of the controller 540. The semiconductor device according to the embodiments of the present invention may be provided in the memory 520 or may be provided as a part of the controller 540 and the I/O device 510.

The electronic system 2 may be applied to a PDA (Personal Digital Assistant), a portable computer, a web tablet, a wireless phone, a mobile phone, a digital music player, a memory card, or any electronic devices that can transmit and/or receive information in wireless environments, as examples.

In concluding the detailed description, those skilled in the art will appreciate that many variations and modifications can be made to the embodiments without substantially departing from the principles of the present invention. Therefore, the disclosed embodiments should not be considered as limiting the full scope of the invention.

What is claimed is:

1. A semiconductor device comprising:
   at least one SRAM cell,
   wherein the SRAM cell includes a pull-up transistor, a pull-down transistor, and a pass-gate transistor, and
   an inversion-layer thickness (Tinv) of a gate stack of the pass-gate transistor is different from a Tinv of a gate stack of the pull-up transistor and Tinv of a gate stack of the pull-down transistor, and
   wherein a nitrogen concentration of a gate insulating film of the pass-gate transistor is different from a nitrogen concentration of a gate insulating film of the pull-up transistor and a nitrogen concentration of a gate insulating film of the pull-down transistor.

2. The semiconductor device of claim 1, wherein the gate insulating film of each of the transistors comprises a high-k material.

3. The semiconductor device of claim 1, wherein an interface film is formed between a substrate and the gate insulating film of each of the transistors, and
   a nitrogen concentration of the interface film of the pass-gate transistor is different from a nitrogen concentration of the interface film of the pull-up transistor and a nitrogen concentration of the interface film of the pull-down transistor.

4. The semiconductor device comprising:
   at least one SRAM cell,
   wherein the SRAM cell includes a pull-up transistor, a pull-down transistor, and a pass-gate transistor, and
   an inversion-layer thickness (Tinv) of a gate stack of the pass-gate transistor is different from Tinv of a gate stack of the pull-up transistor and Tinv of a gate stack of the pull-down transistor, and
   wherein a gate electrode of each of the transistors comprises a first metal electrode formed on the gate insulating film and a second metal electrode formed on the first metal electrode, and
   a thickness of the second metal electrode of the pass-gate transistor is different from a thickness of the second metal electrode of the pull-up transistor and a thickness of the second metal electrode of the pull-down transistor.

5. The semiconductor device of claim 4, wherein the first metal electrode of each of the transistors comprises LaO, Y2O3, Lu2O3, SrO, or a combination thereof.

6. The semiconductor device of claim 4, wherein the second metal electrode of each of the transistors comprises TiN, TaN, or a combination thereof.

7. A semiconductor device comprising:
   at least one SRAM cell, comprising:
      a pull-up transistor,
      a pull-down transistor, and
      a pass-gate transistor,
   wherein a nitrogen concentration of a gate insulating film of the pass-gate transistor is different from a nitrogen concentration of a gate insulating film of the pull-up transistor and a nitrogen concentration of a gate insulating film of the pull-down transistor.

8. The semiconductor device of claim 7, wherein the gate insulating film of each of the transistors comprises a high-k material.

9. The semiconductor device of claim 7, wherein:
   an interface film is formed between a substrate and the gate insulating film of each of the transistors, and
   a nitrogen concentration of the interface film of the pass-gate transistor is different from a nitrogen concentration of the interface film of the pull-up transistor and a nitrogen concentration of the interface film of the pull-down transistor.

10. The semiconductor device of claim 7, wherein:
    a gate electrode of each of the transistors includes a first metal electrode formed on a gate insulating film and a second metal electrode formed on the first metal electrode, and
    a thickness of the second metal electrode of the pass-gate transistor is different from a thickness of the second metal electrode of the pull-up transistor and a thickness of the second metal electrode of the pull-down transistor.

11. The semiconductor device of claim 10, wherein the first metal electrode of each of the transistors comprises LaO, Y2O3, Lu2O3, SrO, or a combination thereof.

12. The semiconductor device of claim 10, wherein the second metal electrode of each of the transistors comprises TiN, TaN, or a combination thereof.

13. The semiconductor device of claim 7, wherein an inversion-layer thickness (Tinv) of a gate stack of the pass-gate transistor is different from a Tinv of a gate stack of the pull-up transistor and Tinv of a gate stack of the pull-down transistor.

14. An electronic system comprising a semiconductor device, including:
    at least one SRAM device comprising:
       a pull-up transistor,
       a pull-down transistor, and
       a pass-gate transistor, wherein the nitrogen characteristics of the pass-gae transistor are different from nitrogen characteristics of the pull-up transistor and pull-down transistor;
    a controller;
    an input/output (I/O) device;
    an interface; and
    a bus configured to interconnect one or more of the controller, the I/O device, and the interface.

15. The system of claim 14, wherein a nitrogen concentration of a gate insulating film of the pass-gate transistor is different from a nitrogen concentration of a gate insulating film of the pull-up transistor and a nitrogen concentration of a gate insulating film of the pull-down transistor.

16. The system of claim 14, wherein the gate insulating film of each of the transistors comprises a high-k material.

17. The system of claim 14, wherein:
    an interface film is formed between a substrate and the gate insulating film of each of the transistors, and
    a nitrogen concentration of the interface film of the pass-gate transistor is different from a nitrogen concentration of the interface film of the pull-up transistor and a nitrogen concentration of the interface film of the pull-down transistor.

18. The system of claim 14, wherein:
    a gate electrode of each of the transistors includes a first metal electrode formed on a gate insulating film and a second metal electrode formed on the first metal electrode, and
    a thickness of the second metal electrode of the pass-gate transistor is different from a thickness of the second metal electrode of the pull-up transistor and a thickness of the second metal electrode of the pull-down transistor.

19. The system of claim 14, wherein an inversion-layer thickness (Tinv) of a gate stack of the pass-gate transistor is different from a Tinv of a gate stack of the pull-up transistor and Tinv of a gate stack of the pull-down transistor.

* * * * *